US007940152B1

(12) United States Patent
Kim et al.

(10) Patent No.: US 7,940,152 B1
(45) Date of Patent: May 10, 2011

(54) MULTI-PRIMARY AND DISTRIBUTED SECONDARY TRANSFORMER FOR POWER AMPLIFIER SYSTEMS

(75) Inventors: Woonyun Kim, Johns Creek, GA (US); Jihwan Kim, Atlanta, GA (US); Chang-Ho Lee, Marietta, GA (US); Joy Laskar, Marietta, GA (US)

(73) Assignees: Samsung Electro-Mechanics Company, Ltd. (KR); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 12/785,020

(22) Filed: May 21, 2010

(51) Int. Cl.
*H01F 27/28* (2006.01)

(52) U.S. Cl. ......................... 336/180; 336/182; 336/184

(58) Field of Classification Search .................... 323/69, 323/252, 276, 79; 336/200, 223, 232, 180, 336/182, 184
See application file for complete search history.

(56) References Cited

U.S. PATENT DOCUMENTS

| | | | | |
|---|---|---|---|---|
| 3,172,034 | A * | 3/1965 | Hilker | 323/252 |
| 6,548,966 | B2 * | 4/2003 | Kawasaka et al. | 315/291 |
| 7,289,338 | B2 * | 10/2007 | Kawasaki et al. | 363/16 |
| 7,400,708 | B2 * | 7/2008 | Takahashi et al. | 378/109 |
| 2003/0137382 | A1 * | 7/2003 | Mayfield et al. | 336/182 |
| 2006/0049903 | A1 * | 3/2006 | Wolfgram | 336/180 |

* cited by examiner

*Primary Examiner* — Anh T Mai
(74) *Attorney, Agent, or Firm* — Sutherland Asbill & Brennan LLP

(57) ABSTRACT

A multi-primary and distributed transformer is provided for one or more sets of parallel-connected or series-connected power amplifiers. The transformer may include a plurality of primary windings, including a first primary winding, a second primary winding, a third primary winding, and a fourth primary winding, where each of the plurality of primary windings is not directly connected to any other of the plurality of primary windings, where each primary winding includes a respective positive port and a negative port for receiving respective differential signals, where each primary winding include a respective first number of turns; and a single secondary winding having a plurality of segments, including a first segment and a second segment, where each segment includes a second number of turns, the second number of turns greater than or equal to the respective first number of turns, where the single secondary winding includes at least one output port.

20 Claims, 6 Drawing Sheets

MULTI-PRIMARY AND DISTRIBUTED SECONDARY TRANSFORMER FOR POWER AMPLIFIER SYSTEMS

FIELD OF INVENTION

Example embodiments of the invention relate generally to transformers, and more particularly, to systems and methods for voltage-boosting transformers to couple one or more power amplifiers to a load.

BACKGROUND OF THE INVENTION

With the ever-growing needs for wireless communications, much more efforts to provide a fully integrated radio frequency (RF) transceiver have been made in order to achieve lighter bill of materials, smaller form factor, and more functionality. To meet the requirements of wireless systems, power amplifiers (PAs) using Complementary Metal-Oxide-Semiconductor (CMOS) technology is a good candidate, and higher level of transceiver integration including PA has recently been demonstrated for some wireless communications such as wireless LAN, Bluetooth, and Cordless phone. However, fully integrating a power amplifier on silicon or silicon based wafer still presents a variety of difficulties. In particular, two major issues in the design of fully-integrated high-speed solid state power amplifiers using CMOS are (1) the low breakdown voltage of the transistors, and (2) the lossy substrate on which the performance of the passive components such as inductors and transformers is degraded.

Due to these and other drawbacks, there is an opportunity for simultaneous power combining and impedance transformation by transformer-type output networks. Likewise, there is an opportunity for multi-primary and distributed secondary transformers for power amplifier systems.

BRIEF SUMMARY OF THE INVENTION

Some or all of the above needs and/or problems may be addressed by certain embodiments of the invention. According to an example embodiment, there is a transformer for parallel-connected power amplifiers. The transformer may include a plurality of primary windings, including a first primary winding, a second primary winding, a third primary winding, and a fourth primary winding, where each of the plurality of primary windings is not directly connected to any other of the plurality of primary windings, where each primary winding includes a respective positive port and a negative port for receiving respective differential signals, where each primary winding include a respective first number of turns; and a single secondary winding having a plurality of segments, including a first segment and a second segment, where each segment includes a second number of turns, the second number of turns greater than or equal to the respective first number of turns, where the single secondary winding includes at least one output port, where both the first primary winding and the second primary winding are positioned adjacent to the first segment of the single secondary winding in order to inductively couple the first and second primary windings to the first segment of the single secondary winding, and where both the third primary winding and the fourth primary winding are positioned adjacent to the second segment of the single secondary winding in order to inductively couple the third and fourth primary windings to the second segment of the single secondary winding.

According to another example embodiment, there is another transformer for series-connected power amplifiers. The transformer may include a plurality of primary windings, including a first primary winding, a second primary winding, a third primary winding, a fourth primary winding, where each of the plurality of primary windings is not directly connected to any other of the plurality of primary windings, where each primary winding includes a respective positive port and a negative port for receiving respective differential signals, where each primary winding include a respective first number of turns; and a single secondary winding having a plurality of segments, including a first segment and a second segment, where each segment includes a second number of turns, the second number of turns greater than or equal to the respective first number of turns, where the single secondary winding includes at least one output port, where both the first primary winding and the third primary winding are positioned adjacent to the first segment of the single secondary winding in order to inductively couple the first and third primary windings to the first segment of the single secondary winding, and where both the second primary winding and the fourth primary winding are positioned adjacent to the second segment of the single secondary winding in order to inductively couple the second and fourth primary windings to the second segment of the single secondary winding.

BRIEF DESCRIPTION OF THE DRAWINGS

Figure 1:
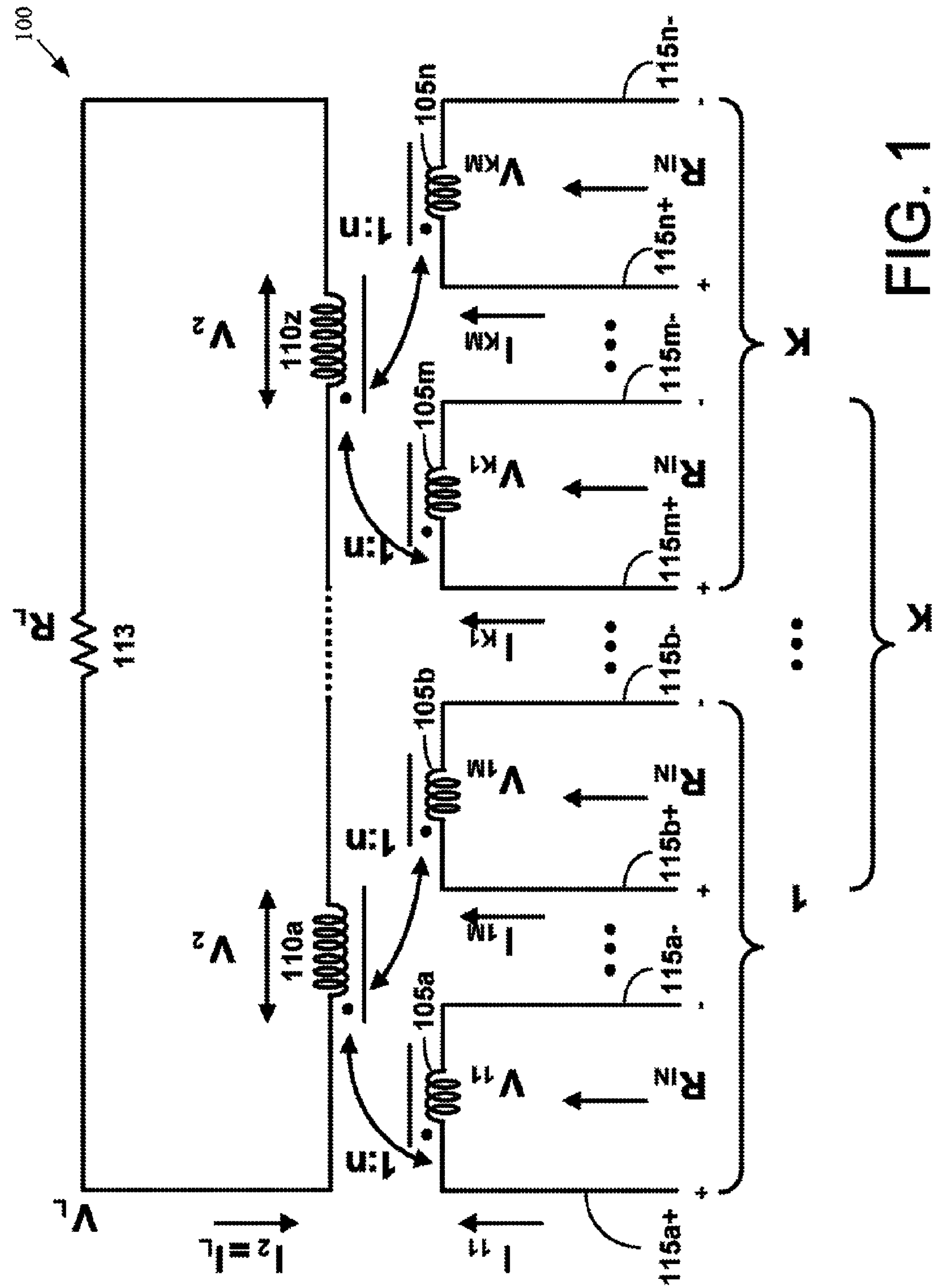

Having thus described the invention in general terms, reference will now be made to the accompanying drawings, which are not necessarily drawn to scale, and wherein:

FIG. 1 illustrates an example circuit schematic diagram of an example power combining transformer in accordance with an example embodiment of the invention.

Figure 2:
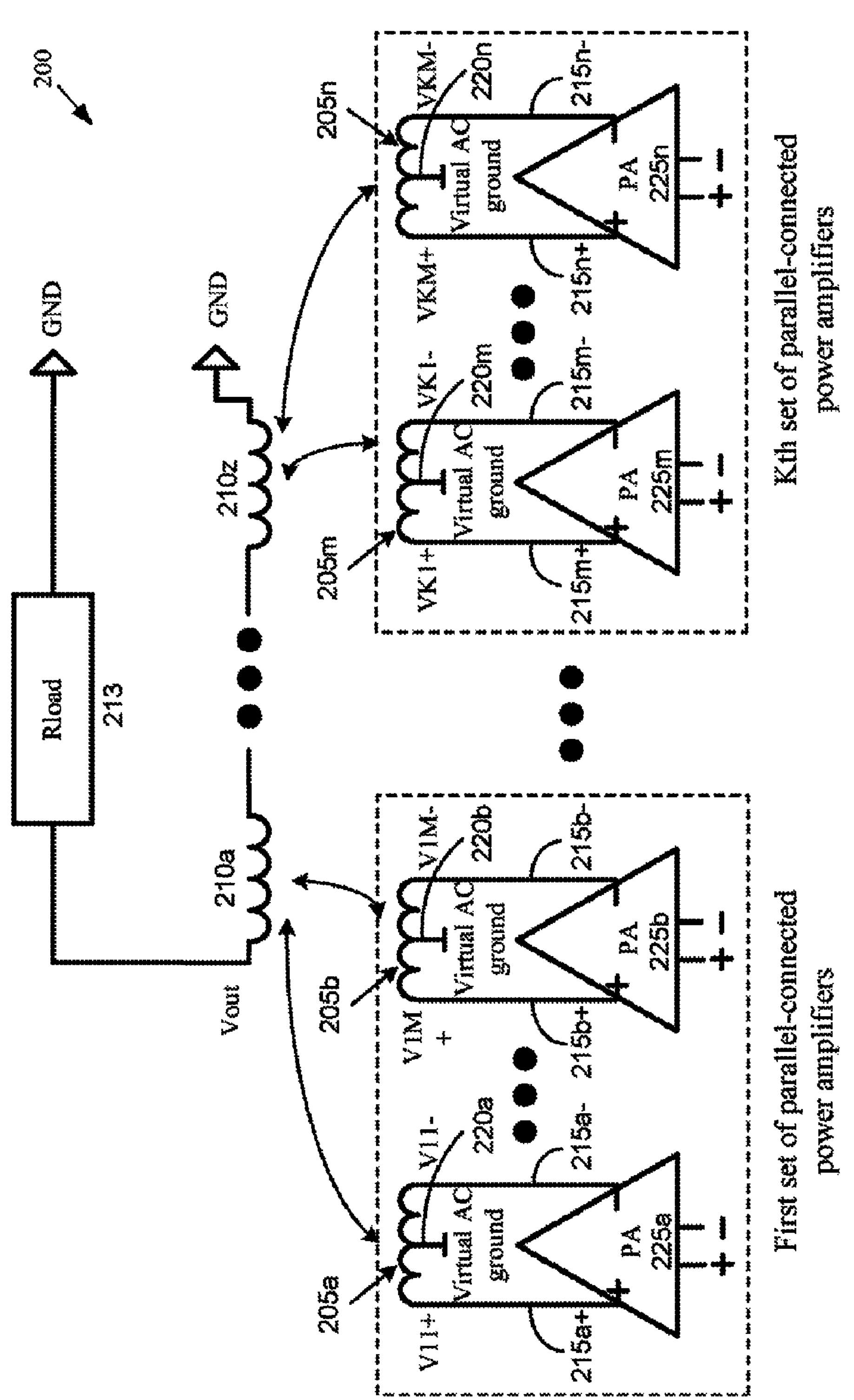

FIG. 2 illustrates an example system in which parallel-connected power amplifiers are utilized with an example power combining transformer in accordance with example embodiment of the invention.

Figure 3:
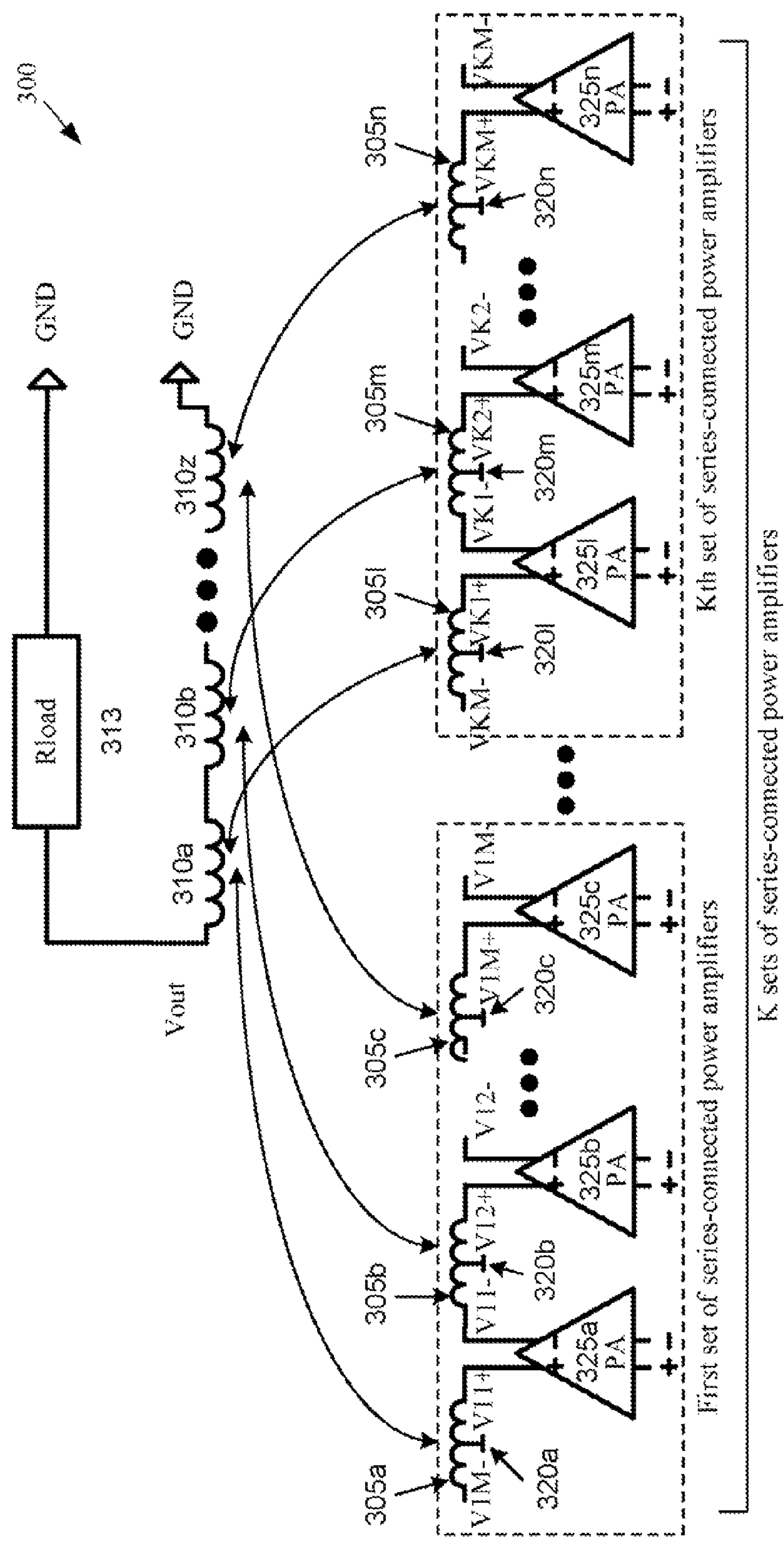

FIG. 3 illustrates an example system in which series-connected power amplifiers are utilized with an example power combining transformer in accordance with example embodiment of the invention.

Figure 4:
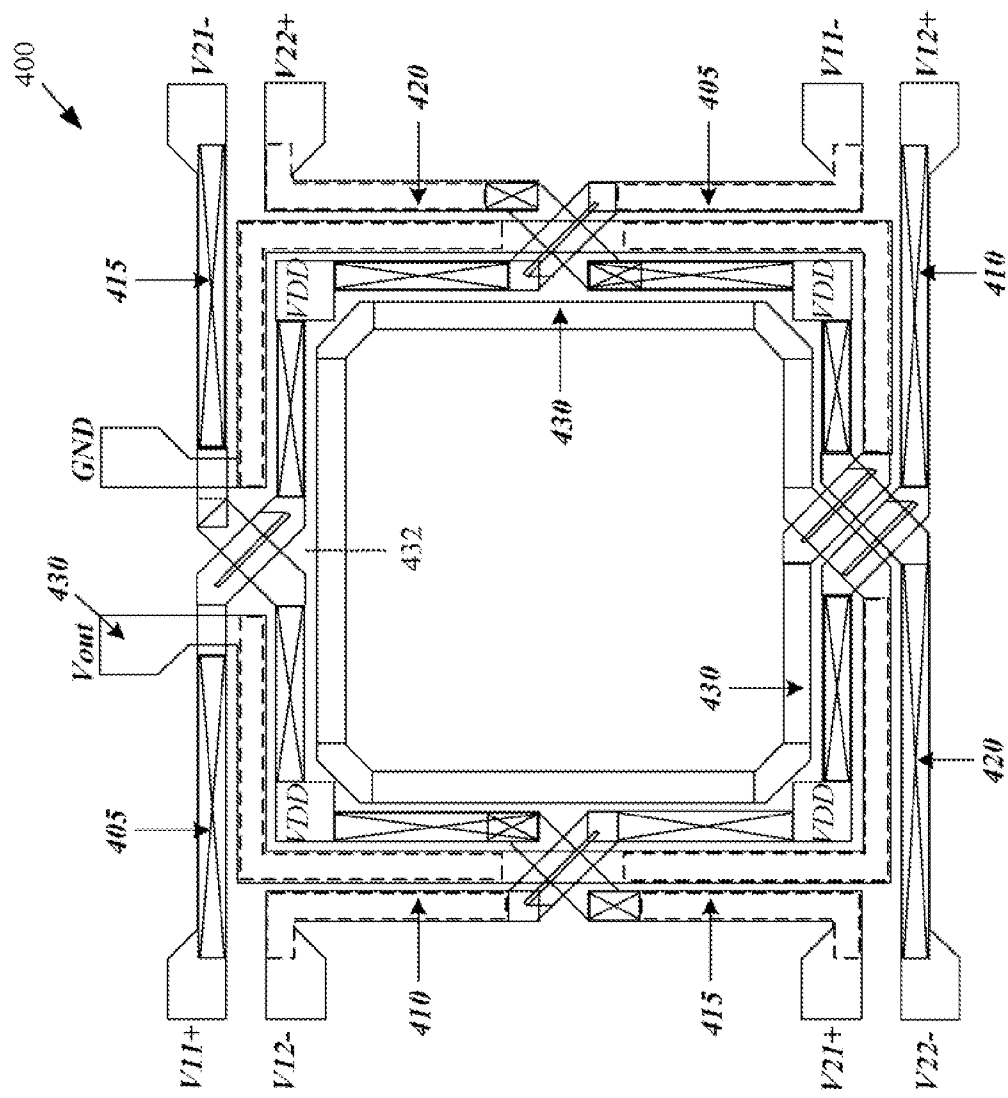

FIG. 4 illustrates an example layout structure for an example transformer utilized with parallel-connected power amplifiers (PAs), according to an example embodiment of the invention.

Figure 5:
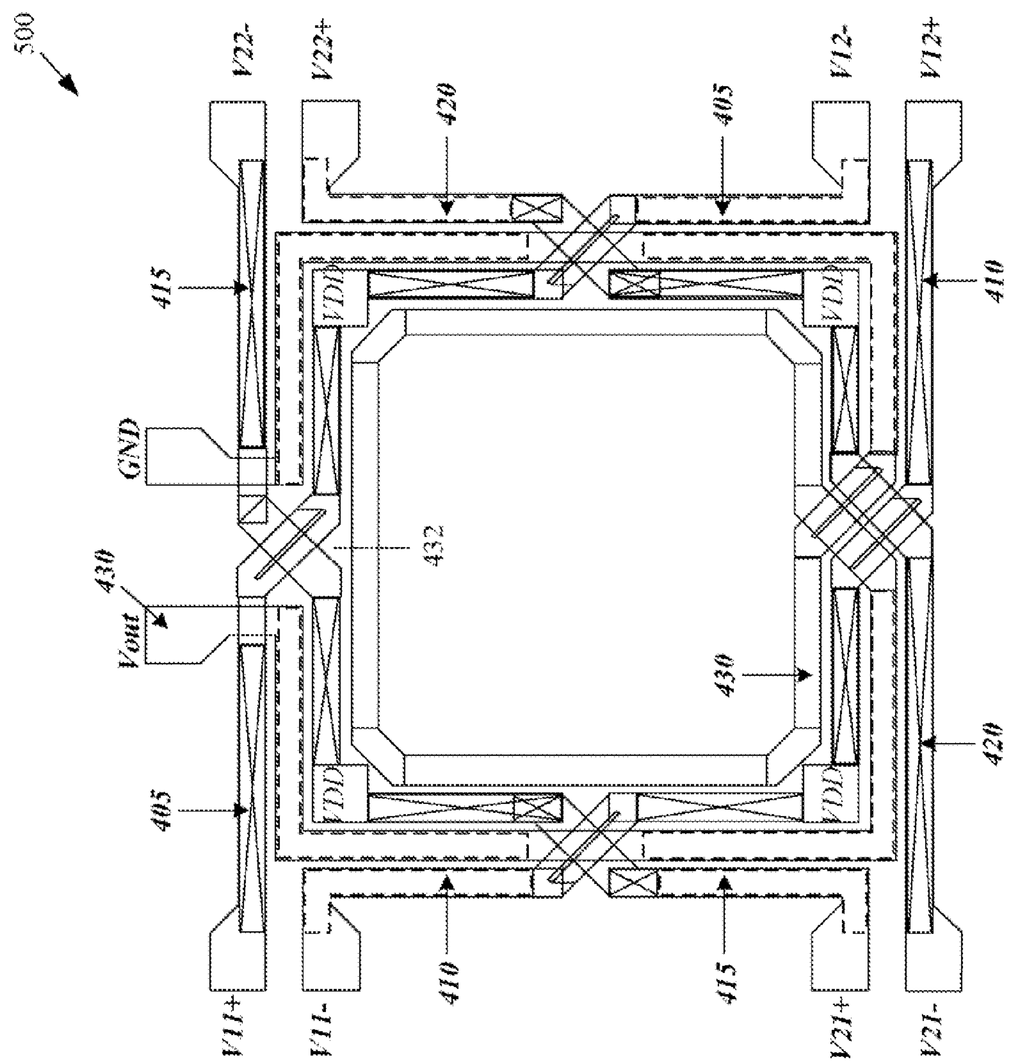

FIG. 5 illustrates an example layout structure for an example transformer utilized with series-connected power amplifiers (PAs), according to an example embodiment of the invention.

Figure 6:
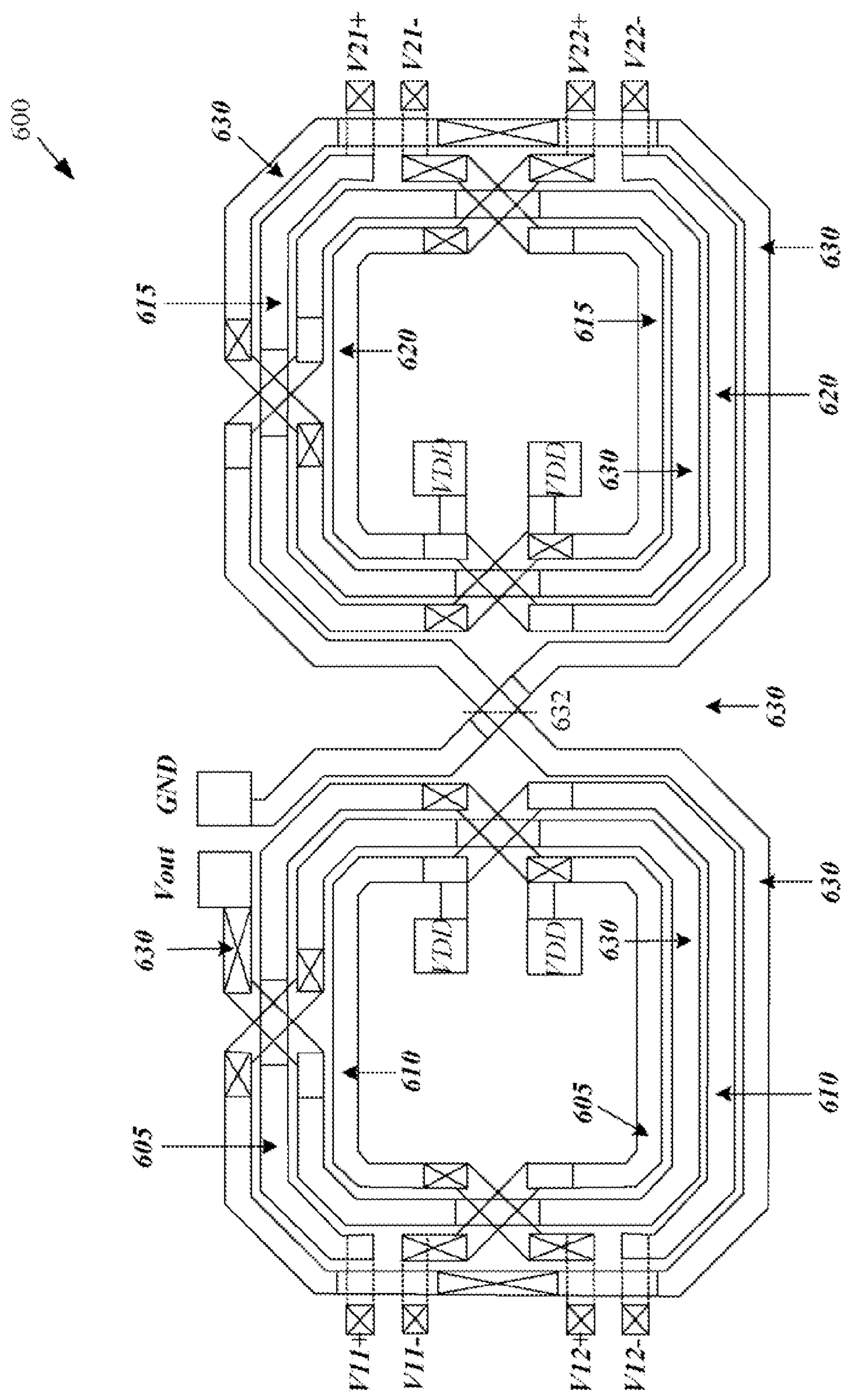

FIG. 6 illustrates another example layout structure for an example transformer, according to an example embodiment of the invention.

DETAILED DESCRIPTION OF THE INVENTION

Embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

According to an example embodiment of the invention, there may be a power amplifier system and associated method. The systems and methods may include a plurality of sets of parallel-connected power amplifiers. A set of power amplifiers may include power amplifiers where each power amplifier includes at least one output port. Each set of power amplifiers may also include or be associated with a respective plurality of primary windings each having a first number of turns, and a single secondary winding having a plurality of segments or portions inductively coupled to the plurality of primary windings, where the segments or portions of the secondary winding include a second number of turns as many as or greater than the first number of turns.

According to another example embodiment of the invention, there is another power amplifier system and method. The systems and methods may efficiently improve the power output of an RF signal to be amplified. The systems and methods may include a plurality of sets of series-connected power amplifiers. Each set of power amplifiers may include respective power amplifiers connected with one another power amplifiers in a circular geometry where the adjacent amplifiers are driven with an input signal of an opposite phase. The systems and methods may also include a plurality of primary windings each having a first number of turns, and a single secondary winding having a plurality of segments or portions inductively coupled to the plurality of primary windings, where the segments or portions of the secondary winding include a second number of turns as many as or greater than the first number of turns.

FIG. 1 illustrates an example circuit schematic diagram of an example power combining transformer 100 in accordance with an example embodiment of the invention. As shown in FIG. 1, there transformer 100 includes a plurality of primary windings 105*a-n*, and a single secondary winding 110. The plurality of primary windings 105*a-n* may be distinct and not directly connected to each other. Each primary winding 105*a-n* may include a first number of turns, including a partial turn (e.g., less than one full turn), which may or may not be the same number for all the primary windings 105*a-n*. The single secondary winding 110 can be connected to at least one load 113 with a load resistance $R_L$. In an example embodiment, the at least one load 113 may be at least one antenna, matching network, balun, or the like. The single secondary winding 110 may be distributed such that there are a plurality of secondary coupling segments or portions 110*a-z*. Each secondary coupling segment or portion 110*a-z* may have a respective second number of turns, including a partial turn (e.g., less than 1 full turn). These coupling segments or portions 110*a-z* may be connected in series to form the single secondary winding. For example, if there are two coupling segments or portions 110*a*, 110*z*, then a first end/port of coupling segment 110*a* can be connected to a first end/port of the load 113; a second end/port of coupling segment 110*a* can be connected to a first end/port of coupling segment 110*z*; and a second end/port of coupling segment 110*z* can be connected to a second end/port of load 113 (or a common ground).

The plurality of primary windings 105*a-n* may be allocated across K sets of primary windings. For example, a first set of primary windings may include at least primary windings 105*a*, 105*b*. Likewise, a Kth set of primary windings may include at least primary windings 105*m*, 105*n*. It will be appreciated that each of the K sets of primary windings may be associated with a respective plurality of power amplifiers (PAs), which can include differential PAs, according to an example embodiment of the invention. Each of the PAs associated with a particular set of primary windings can share a common set of RF inputs (e.g., differential inputs), according to an example embodiment of the invention. Likewise the PAs associated with at least two sets can also share a common set of inputs without departing from example embodiments of the invention. The output nodes of each PA may be connected to efficiently enhance the power output of an RF signal to be amplified and transferred to the load.

In FIG. 1, each of the plurality of primary windings 105*a-n* includes a respective positive port 115*a-n*+, and a respective negative port 115*a-n*−. Each pair of positive ports 115*a-n*+ and negative ports 115*a-n*− of a particular primary winding 105*a-n* can receive respective positive and negative differential signals, either both from the same PA (e.g., for parallel-connected PAs), or a positive differential signal from a first PA and a negative differential signal from a second PA (for series-connected PAs), according to an example embodiment of the invention.

In FIG. 1, each of the primary windings 105*a-n* may be inductively coupled to a respective secondary coupling segment or portion 110*a-z* of the single secondary winding 110. For example, in the first set, at least primary windings 105*a*, 105*b* may be inductively coupled to the secondary coupling segment or portion 110*a* of the single secondary winding 110. It will be appreciated that the first set may additionally include other primary windings that are also inductively coupled to the secondary coupling segment or portion 110*a* of the single secondary winding 110. Similarly, for the Kth set, at least primary windings 105*m*, 105*n* may be inductively coupled to the secondary coupling segment or portion 110*z* of the single secondary winding 110. It will be appreciated that the Kth set may additionally include other primary windings that are also inductively coupled to the secondary coupling segment or portion 110*z* of the single secondary winding 110. While FIG. 1 illustrates all the primary windings 105*a-n* of a particular set being inductively coupled to the same secondary coupling segment or portion 110*a-z*, many variations are available without departing from example embodiments of the invention. For example, primary windings 105*a*, 105*m* may be inductively coupled to secondary coupling segment or portion 110*a* while primary windings 105*b*, 105*n* may be inductively coupled to secondary coupling segment or portion 110*z*.

According to an example embodiment of the invention, the turns ratio from each primary winding 105*a-n* to a secondary coupling segment or portion 110*a-n* of the single secondary winding 110 may be 1:n, where n≧1, which means that the secondary coupling segment or portion 110*a-n* has at least the same or a greater number or turns than each primary winding(s) 110*a-n* inductively coupled to it. In this way, the voltage may be boosted from V1 at the primary winding 105*a-n* to V2 at the secondary coupling segment or portion 110*n*, where V2>V1.

It will be appreciated that many variations of the example power combining transformer 100 are available without departing from example embodiments of the invention.

FIG. 2 illustrates an example system 200 in which parallel-connected power amplifiers are utilized with an example power combining transformer in accordance with example embodiment of the invention. The parallel-connected power amplifiers may be connected with the adjacent amplifiers to be driven with an input signal of equal magnitude and same phase so that the output signal of the secondary load could be properly and economically amplified, according to an example embodiment of the invention. In FIG. 2, the example transformer may be similar to that described with respect to FIG. 1. More specifically, the example transformer of FIG. 2 may include a plurality of primary windings 205*a-n*, and a single secondary winding 210 having at least a plurality of secondary coupling segments or portions 210*a-z*. A load 213, which may be an antenna, matching network, balun, etc. may be connected to the single secondary winding 210.

In FIG. 2, there may be K sets of parallel-connected power amplifiers (PAs). More specifically, there may be at least a first set of parallel-connected PAs and a Kth set of parallel-connected PAs. In an example embodiment of the invention, the PAs may be differential PAs, perhaps using MOSFETs and CMOS technologies.

The first set may include two or more PAs 225*a*, 225*b*. Each of the PAs 225*a*, 225*b* may be connected in parallel such that the respective differential outputs (e.g., positive (+) output and negative (−) output) of the power amplifiers are provided to respective positive and negative ports of the respective primary windings 205*a*, 205*b*. For example, the respective positive and negative differential outputs from PA 225*a* may be provided to the respective positive port 215*a*+ (voltage V11+) and negative port 215*a*− (voltage V11−) of primary winding 205*a*. Likewise, the respective positive and negative differential outputs from PA 225*b* may be provided to the respective positive port 215*b*+ (voltage V1M+) and negative port 215*b*− (voltage V1M−) of primary winding 205*b*.

Similarly, the Kth set may include two or more PAs 225*m*, 225*n*. Each of the PAs 225*m*, 225*n* may be connected in parallel such that the respective differential outputs (e.g., positive (+) output and negative (−) output) of the power amplifiers are provided to respective positive and negative ports of the respective primary windings 205*m*, 205*n*. For example, the respective positive and negative differential outputs from PA 225*m* may be provided to the respective positive port 215*m*+ (voltage VK1+) and negative port 215*m*− (voltage VK1−) of primary winding 205*m*. Likewise, the respective positive and negative differential outputs from PA 225*n* may be provided to the respective positive port 215*n*+ (voltage VKM+) and negative port 215*n*− (voltage VKM−) of primary winding 205*n*. The primary windings of the Kth set, including primary windings 205*m*, 205*n*, are inductively coupled to the secondary coupling segment or portion 210*z* of secondary winding 210.

Each of the power amplifiers in a set may be driven using common differential input signals. For example, in the first set, the PAs 225*a*, 225*b* may receive first common RF differential input signals. Likewise, for the Kth set, the PAs 225*m*, 225*n* may receive Kth common RF differential input signals. However, in example embodiments of the invention, the PAs in both the first set and second set can all receive common RF differential input signals without departing from example embodiments of the invention.

In addition, each of the primary windings 205*a-n* may include a respective tap port 220*a-n*. If a respective tap port 220*a-n* is located near or at the center of respective primary winding 205*a-n*, it may be referred to as a center tap port, which may be at a virtual AC ground. The respective tap ports 220*a-n* may be used to provide DC biasing for respective power amplifiers 225*a-n*. Alternatively or additionally, the respective tap port 220*a-n* can also be used to connect one or more tuning blocks, which can be used to adjust an operational frequency, implement delay, and the like. The adjustment of the operational frequency, implement delay, and the like may be needed to correct for delay or synchronization issues related to the provision of inputs or outputs of the PAs 225*a-n*. In example embodiment of the invention, the resonant blocks comprising series or parallel combinations of at least on inductor and at least one capacitor.

The primary windings of the first set, including primary windings 205*a*, 205*b*, may be inductively coupled, at least in substantial part, to the secondary coupling segment or portion 210*a* of secondary winding 210. However, that part of secondary coupling segment or portion 210*a* that is inductively coupled by the primary winding 205*a* may not necessarily be the same physical part of the secondary coupling segment or portion 210*a* that is inductively coupled by the primary winding 205*b*. Likewise, the primary windings of the Kth set, including primary windings 205*m*, 205*n*, may be inductively coupled, at least in substantial part, to the secondary coupling segment or portion 210*z* of secondary winding 210. It will be appreciated that while the primary windings 205*a-n* of the first set and second sets are illustrated in FIG. 2 as being inductively coupled to the respective secondary coupling segments or portions 210*a*, 210*z*, they may additionally be inductively coupled, perhaps in an ancillary manner, to another secondary coupling segment or portion without departing from example embodiments of the invention.

FIG. 3 illustrates an example system 300 in which series-connected power amplifiers are utilized with an example power combining transformer in accordance with example embodiment of the invention. The series-connected power amplifiers may be connected with the adjacent amplifiers to be driven with an input signal of equal magnitude and opposite phase so that the output signal of the secondary load could be properly and economically amplified, according to an example embodiment of the invention. In FIG. 3, the example transformer may be a variation of the transformer described with respect to FIG. 1. More specifically, the example transformer of FIG. 3 may include a plurality of primary windings 305*a-n*, and a single secondary winding having at least a plurality of secondary coupling segments or portions 310*a-z*. A load 313, which may be an antenna, matching network, balun, etc. may be connected to the single secondary winding 310.

In FIG. 3, there may be K sets of series-connected power amplifiers (PAs). More specifically, there may be at least a first set of series-connected PAs and a Kth set of series-connected PAs. In an example embodiment of the invention, the PAs may be differential PAs, perhaps using MOSFETs and CMOS technologies.

The first set may include two or more PAs 325*a*, 325*b*, 325*c*. Each of the PAs 325*a*, 325*b*, 325*c* may be connected in series in what can be referred to as a circular geometry, according to an example embodiment of the invention. To enable such a circular geometry, an output node of PAs 325*a*, 325*b*, 325*c* may be connected with an opposite output node of the adjacent PAs through a primary winding 305*a*, 305*b*, 305*c*. For example, the negative output node V11− of the PA 325*a* is connected with the positive output node V12+ of the adjacent PA 325*b* through the primary winding 305*b*, and the negative output node V12− of the adjacent PA 325*b* is connected in a similar way. Consequently, a set of series-connected power amplifiers are connected in a circular geometry. And, to enable such a circular geometry, each primary winding 305*a*, 305*b*, and 305*c* may receives a positive and negative differential input signals from one of two different PAs 325*a*, 325*b*, 325*c*. For example, the positive differential output of PA 325*a* may be provided to the positive port 305*a*+ (voltage V11+) of primary winding 305*a* while the negative differential output of PA 325*a* may be provided to the negative port 305*b*− (voltage V11−) of primary winding 305*b*. In addition, the positive differential output of PA 325*b* may be provided to the positive port 305*b*+ (voltage V12+) of primary winding 305*b* while the negative differential output of PA 325*b* may be provided to positive port 305*c*− (voltage VM12−) of PA 325*c*, or another positive port of an adjacent intervening PA. Similarly, the positive differential output of PA 325*c* may be provided to the positive port 305*c*+ (voltage V1M+) while the negative differential output of PA 325*c* may complete the circular geometry by connecting to the negative port 305*a*− of primary winding 305*a* (voltage V1M−).

Similarly, the Kth set may include two or more PAs **325*l*, 325*m*, 325*n*. Each of the PAs 325*l*, 325*m*, 325*n* may be connected in series in a circular geometry, according to an example embodiment of the invention. To enable such a circular geometry, an output node of PAs 325*l*, 325*m*, 325*n* may be connected with an opposite output node of the adjacent PAs through a primary winding 305*l*, 305*m*, 305*n*. For example, the positive differential output of PA 325*l* may be provided to the positive port 305*l*+ (voltage VK1+) of primary winding 305*l* while the negative differential output of PA 325*l* may be provided to the negative port 305*m*− (voltage VK1−) of primary winding 305*m*. In addition, the positive differential output of PA 325*m* may be provided to the positive port 305*m*+ (voltage VK2+) of primary winding 305*m* while the negative differential output of PA 325*m* may be provided to positive port 305*n*− (voltage VK2−) of PA 325*n*, or another positive port of an adjacent intervening PA. Similarly, the positive differential output of PA 325*n* may be provided to the positive port 305*n*+ (voltage VKM+) while the negative differential output of PA 325*n* may complete the circular geometry by connecting to the negative port 305*l*− of primary winding 305*a*** (V1M−).

Each of the power amplifiers in a set may be driven using common differential input signals. For example, in the first set, the PAs **325*a*, 325*b*, 325*c* may receive first common RF differential input signals, or the modified signals of the common RF differential input if necessary, to ensure that adjacent PAs provide opposite phase signals to a single primary winding 305*a*, 305*b*, 305*c*. Likewise, for the Kth set, the PAs 325*l*, 325*m*, 325*n* may receive Kth common RF differential input signals, or the modified signals of the common RF differential input if necessary, to ensure that adjacent PAs provide opposite phase signals to a single primary winding 305*l*, 305*m*, 305*n***. However, in example embodiments of the invention, the PAs in all the sets can all receive common RF differential input signals without departing from example embodiments of the invention.

In addition, each of the primary windings **305*a-n* may include a respective tap port 320*a-n*. If a tap port 320*a-n* is located near or at the center of respective primary winding 305*a-n*, it may be referred to as a center tap port, which may be at a virtual AC ground. The respective tap ports 320*a-n* may be used to provide DC biasing for respective power amplifiers 325*a*, 325*b*. Alternatively or additionally, the respective tap port 320*a-n* can also be used to connect one or more tuning blocks, which can be used to adjust an operational frequency, implement delay, and the like. The adjustment of the operational frequency, implement delay, and the like may be needed to correct for delay or synchronization issues related to the provision of inputs or outputs of the PAs 325*a-n***. In example embodiment of the invention, the resonant blocks comprising series or parallel combinations of at least on inductor and at least one capacitor.

The secondary coupling segment or portion **310*a* may be inductively coupled to both the primary winding 305*a* in the first set and the primary winding 305*l* in the second set. Likewise, the secondary coupling segment or portion 310*b* may be inductively coupled to both the primary winding 305*b* in the first set and the primary winding 305*m* in the second set. Similarly, the secondary coupling segment or portion 310*z* may be inductively coupled to both the primary winding 305*c* in the first set and the primary winding 305*n* in the second set. It will be appreciated that while the primary windings 305*a-n* of the first set and second sets are illustrated in FIG. 3 as being inductively coupled to the respective secondary coupling segments or portions 310*a*, 310*b*, 310*z***, they may additional be inductively coupled, perhaps in an ancillary manner, to another secondary coupling segment or portion without departing from example embodiments of the invention.

FIG. 4 illustrates an example layout structure for an example transformer 400 utilized with parallel-connected power amplifiers (PAs), according to an example embodiment of the invention. The example transformer 400 can be implemented using a planar structure, stacked structure, or a multi-layer structure. With a planar structure, all of the primary windings may be placed substantially in the same metal layer. A secondary winding may be interlaced or interleaved amount the primary windings. With an example stacked structure, all of the primary windings may be placed on one metal layer, and the secondary winding may be placed in another metal layer. With a multi-layer structure, at least two layers are used for providing the primary windings, and the secondary winding can be distributed across the at least two layers and connected with vias.

As show in FIG. 4, there are primary windings 405, 410, 415, and 420. Primary windings 405, 410 may be provided for a first set of parallel-connected PAs while primary windings 415, 420 may be provided for a second set of parallel-connected PAs, according to an example embodiment of the invention. Each of the primary windings 405, 410, 415, and 420 may include about half a turn in FIG. 4, although variations of the number of turns are available without departing from example embodiments of the invention. Each of the primary windings 405, 410, 415, and 420 may include a center tap port, which may be at a virtual AC ground, for providing a DC bias signal (VDD) to a connected PA, or to otherwise connect to a tuning block. FIG. 4 also shows a secondary winding 430 having about two full turns, although variations of the number of turns are available without departing from example embodiments of the invention.

A first primary winding 405 may have a first positive port and a first negative port for receiving respective differential signals (voltages V11+, V11−) from a first differential PA in the first set. A second primary winding 410 may have a second positive port and a second negative port for receiving respective differential signals (voltages V12+, V12−) from a second differential PA in the first set. It will be appreciated that the primary windings 405, 410 may be collectively inductively coupled to a first portion or segment of the secondary winding 430. More specifically, the primary windings 405, 410 may be collectively cover about one full turn that is interweaved or interlaced with the first portion of segment of the secondary winding 430 that likewise comprises about one full turn, according to an example embodiment of the invention. The first portion of segment of the secondary winding 430 can be provided from the output (Vout) port of the secondary winding 430 to about the midpoint 432 of the secondary winding 430, according to an example embodiment of the invention. It will be appreciated that primary windings 405, 410 may also be inductively coupled, perhaps in an ancillary manner, to other portions or segments of the secondary winding without departing from example embodiments of the invention.

A third primary winding 415 may have a third positive port and a third negative port for receiving respective differential signals (voltages V21+, V21−) from a third differential PA in the second set. A fourth primary winding 420 may have a fourth positive port and a fourth negative port for receiving respective differential signals (voltages V22+, V22−) from a fourth differential PA in the second set. It will be appreciated that the primary windings 415, 420 may be collectively inductively coupled to a second portion or segment of the secondary winding 430. More specifically, the primary windings 415, 420 may be collectively cover about one full turn that is interweaved or interlaced with the first portion of segment of the secondary winding 430 that likewise comprises about one full turn, according to an example embodiment of the invention. The second portion of segment of the secondary winding 430 can be provided from the grounded (GND) port of the secondary winding 430 to about the midpoint 432 of the secondary winding 430, according to an example embodiment of the invention. It will be appreciated that primary windings 415, 420 may also be inductively coupled, perhaps in an ancillary manner, to other portions or segments of the secondary winding without departing from example embodiments of the invention.

FIG. 5 illustrates an example layout structure for an example transformer 500 utilized with series-connected power amplifiers (PAs), according to an example embodiment of the invention. The example transformer 500 of FIG. 5 may be structurally equivalent to the example transformer 400 discussed with respect to FIG. 4. However, in FIG. 5, the example transformer 500 may be connected to series-connected PAs configured in a circular geometry according to an example embodiment of the invention.

In FIG. 5, primary windings 505, 510 may be provided for a first set of series-connected PAs while primary windings 515, 520 may be provided for a second set of series-connected PAs, according to an example embodiment of the invention. In particular, the first primary winding 505 may have a first positive port connected to a first positive signal (voltage V11+) of a first differential PA, and a first negative port connected to a second negative signal (voltage V12−) of a second differential PA. Likewise, a second primary winding 510 may have a second positive port connected to a second positive signal (voltage V12+) of the second differential PA, and a second negative port connected to the first negative positive signal (voltage V11−) of the first differential PA.

Similarly, the third primary winding 515 may have a third positive port connected to a third positive signal (voltage V21+) of a third differential PA, and a third negative port connected to a fourth negative signal (voltage V22−) of a fourth differential PA. Likewise, a fourth primary winding 520 may have a fourth positive port connected to a fourth positive signal (voltage V22+) of the fourth differential PA, and a fourth negative port connected to the third negative positive signal (voltage V21−) of the third differential PA.

FIG. 6 illustrates another example layout structure for an example transformer 600, according to an example embodiment of the invention. The example transformer 600 can be utilized with parallel-connected power amplifiers (PAs), although in an alternative embodiment, the transformer 600 can equally be applied to series-connected PAs as well. The example transformer 600 can be implemented using a planar structure, stacked structure, or a multi-layer structure. With a planar structure, all of the primary windings may be placed substantially in the same metal layer. A secondary winding may be interlaced or interleaved amount the primary windings. With an example stacked structure, all of the primary windings may be placed on one metal layer, and the secondary winding may be placed in another metal layer. With a multi-layer structure, at least two layers are used for providing the primary windings (e.g., for each respective set), and the secondary winding can be distributed across the at least two layers and connected with vias.

In FIG. 6, there are primary windings 605, 610, 615, and 620. Primary windings 605, 610 may be provided for a first set of parallel-connected PAs while primary windings 615, 620 may be provided for a second set of parallel-connected PAs, according to an example embodiment of the invention. Each of the primary windings 605, 610, 615, and 620 may include about one full turn in FIG. 6, although variations of the number of turns are available without departing from example embodiments of the invention. Each of the primary windings 605, 610, 615, and 620 may include a center tap port, which may be at a virtual AC ground, for providing a DC bias signal (VDD) to a connected PA, or to otherwise connect to a tuning block. FIG. 6 also shows a secondary winding 630 having about four full turns, although variations of the number of turns are available without departing from example embodiments of the invention.

A first primary winding 605 may have a first positive port and a first negative port for receiving respective differential signals (voltages V11+, V11−) from a first differential PA in the first set. A second primary winding 610 may have a second positive port and a second negative port for receiving respective differential signals (voltages V12+, V12−) from a second differential PA in the first set. It will be appreciated that the primary windings 605, 610 may each have about one full turn such that the respective positive and negative ports are positioned close together and easily connectable to the differential outputs of a respective differential amplifier. The primary windings 605, 610 may be inductively coupled to a first portion or segment of the secondary winding 630. More specifically, the primary windings 605, 610 may be collectively cover about one full turn that is interweaved or interlaced with the first portion of segment of the secondary winding 630 that likewise comprises about two full turns. The first portion of segment of the secondary winding 630 can be provided from the output (Vout) port of the secondary winding 630 to about the midpoint 632 of the secondary winding 630. It will be appreciated that primary windings 605, 610 may also be inductively coupled, perhaps in an ancillary manner, to other portions or segments of the secondary winding 630 without departing from example embodiments of the invention.

A third primary winding 615 may have a third positive port and a third negative port for receiving respective differential signals (voltages V21+, V21−) from a third differential PA in the second set. A fourth primary winding 620 may have a fourth positive port and a fourth negative port for receiving respective differential signals (voltages V22+, V22−) from a second differential PA in the second set. It will be appreciated that the primary windings 615, 620 may each have about one full turn such that the respective positive and negative ports are positioned close together and easily connectable to the differential outputs of a respective differential amplifier. The primary windings 615, 620 may be inductively coupled to a second portion or segment of the secondary winding 630. More specifically, the primary windings 615, 620 may be interweaved or interlaced with the second portion of segment of the secondary winding 630 that likewise comprises about full turn. The second portion of segment of the secondary winding 630 can be provided from the ground (GND) port of the secondary winding 630 to about the midpoint 632 of the secondary winding 630. It will be appreciated that primary windings 615, 620 may also be inductively coupled, perhaps in an ancillary manner, to other portions or segments of the secondary winding 630 without departing from example embodiments of the invention.

It will be appreciated that the transformer 600 of FIG. 6 can also be characterized as two separate and/or symmetrical transformers joined according to their respective secondary windings. According to this characterization, a first transformer can be provided such that the primary windings 605, 610 of the first set can be configured or arranged with a first secondary winding that is equivalent to the first portion or segment of the secondary winding 630. Likewise, a second transformer can be provided such that the primary windings 615, 620 of the second set can be configured or arranged with a second secondary winding that is equivalent to the second portion or segment of the secondary winding 630. The first and second secondary windings can then be electrically connected at the midpoint 632 or via another connection segment to provide a single secondary winding 630 having the first and second portions or segments. The other port of the first secondary winding can provide the output (Vout) port while the other port of the second secondary winding can provide the grounded (GND) port, according to an example embodiment of the invention. The first and second transformers can be provided on respective substrates according to the planar, multi-layer, or stacked structures described herein.

As further example, the first transformer can be formed by interleaving the primary windings 605, 610 with the first portion or segment of the secondary winding 630 in a first pattern (e.g., a spiral pattern), and the second transformer can be formed by interleaving the primary windings 615, 620 with the second portion or segment of the secondary winding 630. These first pattern for the first transformer may not overlap the second pattern for the second transformer or be contained within the other pattern, and the only connection point between the first and second transformer may be where the first and second portions or segments of the secondary winding 630 are connected to form a single secondary winding 630. It will be appreciated that the first and second patterns may be symmetrical according to an example embodiment of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A transformer, comprising a plurality of primary windings, including a first primary winding, a second primary winding, a third primary winding, and a fourth primary winding, wherein each of the plurality of primary windings is not directly connected to any other of the plurality of primary windings, wherein each primary winding includes a respective positive port and a negative port for receiving respective differential signals, wherein each primary winding includes a respective first number of turns; and a single secondary winding having a plurality of segments, including a first segment and a second segment, wherein each segment includes a second number of turns, the second number of turns greater than or equal to the respective first number of turns, wherein the single secondary winding includes at least one output port, wherein both the first primary winding and the second primary winding are positioned adjacent to the first segment of the single secondary winding in order to inductively couple the first and second primary windings to the first segment of the single secondary winding, and wherein both the third primary winding and the fourth primary winding are positioned adjacent to the second segment of the single secondary winding in order to inductively couple the third and fourth primary windings to the second segment of the single secondary winding.

2. The transformer of claim 1, wherein the first and second primary windings are associated with a first set of parallel differential power amplifiers, and wherein the third and fourth primary windings are associated with a second set of parallel differential power amplifiers, wherein the respective differential power amplifiers associated with the first set share a first common set of input signals; and wherein the respective differential power amplifiers associated with the second set share a second common set of input signals.

3. The transformer of claim 2, wherein the first primary winding includes a first positive port and a first negative port, the second primary winding includes a second positive port and a second negative port, the third primary winding includes a third positive port and a third negative port, and the fourth primary winding includes a fourth positive port and a fourth negative port, wherein the first positive port and the first negative port receive respective differential signals from a first differential power amplifier;

wherein the second positive port and the second negative port receive differential signals from a second differential power amplifier;

wherein the third positive port and the third negative port receive differential signals from a third differential power amplifier;

wherein the fourth positive port and the fourth negative port receive differential signals from a fourth differential power amplifier;

wherein the first and second differential power amplifiers are part of the first set of parallel differential power amplifiers; and wherein the third and fourth differential power amplifiers are part of the second set of parallel differential power amplifiers.

4. The transformer of claim 3, wherein the first and second differential power amplifiers of the first set provide substantially the same differential outputs, and wherein the third and fourth differential power amplifiers of the second set provide substantially the same differential outputs.

5. The transformer of claim 1, wherein the first primary winding, the second primary winding, and the first segment of the secondary winding are interleaved into a first pattern, and wherein the third primary winding, the fourth primary winding, and the second segment of the secondary winding are interleaved into a second pattern, the first pattern not overlapping the second pattern, wherein the first segment and second segment of the secondary winding are electrically connected.

6. The transformer of claim 5, wherein the first and second patterns are symmetrical.

7. The transformer of claim 5, wherein the first and second patterns are respective spiral patterns.

8. The transformer of claim 1, wherein each of the plurality of primary windings includes a respective first number of turns that is less than a single turn.

9. The transformer of claim 1, wherein the single secondary winding includes a second number of turns that is more than one full turn.

10. The transformer of claim 1, wherein the output port of the single secondary winding provides a combined output based upon the differential signals received by each of the plurality of primary windings.

11. A transformer, comprising a plurality of primary windings, including a first primary winding, a second primary winding, a third primary winding, and a fourth primary winding, wherein each of the plurality of primary windings is not directly connected to any other of the plurality of primary windings, wherein each primary winding includes a respective positive port and a negative port for receiving respective differential signals, wherein each primary winding includes a respective first number of turns; and a single secondary winding having a plurality of segments, including a first segment and a second segment, wherein each segment includes a second number of turns, the second number of turns greater than or equal to the respective first number of turns, wherein the single secondary winding includes at least one output port, wherein both the first primary winding and the third primary winding are positioned adjacent to the first segment of the single secondary winding in order to inductively couple the first and third primary windings to the first segment of the single secondary winding, and wherein both the second primary winding and the fourth primary winding are positioned adjacent to the second segment of the single secondary winding in order to inductively couple the second and fourth primary windings to the second segment of the single secondary winding.

12. The transformer of claim 11, wherein the first and third primary windings are associated with a first set of series-connected differential power amplifiers, wherein the second and fourth primary windings are associated with a second set of series-connected differential power amplifiers, wherein the respective differential power amplifiers associated with the first set share a first common set of input signals; and wherein the respective differential power amplifiers associated with the second set share a second common set of input signals.

13. The transformer of claim 12, wherein the first primary winding includes a first positive port and a first negative port, the second primary winding includes a second positive port and a second negative port, the third primary winding includes a third positive port and a third negative port, the fourth primary winding includes a fourth positive port and a fourth negative port, wherein the first positive port and the second negative port receive respective differential signals from a first differential power amplifier;

wherein the second positive port receives a second positive differential signal from a second differential power amplifier;

wherein the first negative port receives a first negative differential signal from either (i) the second differential power amplifier if the first set of differential power amplifiers includes only the first and second differential power amplifiers, or (ii) a third differential power amplifier if the first set of differential power amplifiers includes at least the first, second, and third differential power amplifiers;

wherein the third positive port and the fourth negative port receive respective differential signals from a fourth differential power amplifier;

wherein the fourth positive port receives a fourth positive differential signal from a fifth differential power amplifier; and wherein the third negative port receives a third negative differential signal from either (i) the fifth differential amplifier if the second set of differential power amplifiers includes only the fourth and fifth differential power amplifiers, or (ii) a sixth differential power amplifier if the second set of differential power amplifiers includes at least the fourth, fifth, and sixth differential power amplifiers.

14. The transformer of claim 13, wherein the respective differential power amplifiers of the first set provide substantially the same differential outputs, and wherein the respective differential power amplifiers of the second set provide substantially the same differential outputs.

15. The transformer of claim 11, wherein the plurality of primary windings further includes a fifth primary winding and a sixth primary winding, wherein the single secondary winding further includes a third segment, wherein both the fifth primary winding and the sixth primary winding are positioned adjacent to the third segment of the single secondary winding in order to inductively couple the fifth and sixth primary windings to the third segment of the single secondary winding.

16. The transformer of claim 15, wherein the first primary winding includes a first positive port and a first negative port, the second primary winding includes a second positive port and a second negative port, the third primary winding includes a third positive port and a third negative port, the fourth primary winding includes a fourth positive port and a fourth negative port, the fifth primary winding includes a fifth positive port and a fifth negative port, and the sixth primary winding includes a sixth positive port and a sixth negative port, wherein the first positive port and the second negative port receive respective differential signals from a first differential power amplifier;

wherein the second positive port and the fifth negative port receive respective differential signals from a second differential power amplifier;

wherein the fifth positive port and the first negative port receive respective differential signals from a third differential power amplifier;

wherein the third positive port and the fourth negative port receive respective differential signals from a fourth differential power amplifier;

wherein the fourth positive port and the sixth negative port receive respective differential signals from a fifth differential power amplifier;

wherein the sixth positive port and the third negative port receive respective differential signals from a sixth differential power amplifier;

wherein the first, second, and third differential power amplifiers are part of a first set of differential power amplifiers; and wherein the fourth, fifth and sixth differential power amplifiers are part of a second set of differential power amplifiers.

17. The transformer of claim 16, wherein the first, second, and third differential power amplifiers of the first set provide substantially the same differential outputs, and wherein the fourth, fifth, and sixth differential power amplifiers of the second set provide substantially the same differential outputs.

18. The transformer of claim 11, wherein each of the plurality of primary windings includes a respective first number of turns that is less than a single turn.

19. The transformer of claim 11 wherein the single secondary winding includes a second number of turns that is more than one full turn.

20. The transformer of claim 11, wherein the output port of the single secondary winding provides a combined output based upon the differential signals received by each of the plurality of primary windings.

* * * * *